(12) United States Patent
Okumura et al.

(10) Patent No.: US 9,203,372 B2
(45) Date of Patent: Dec. 1, 2015

(54) COMMON MODE FILTER

(71) Applicant: TDK Corporation, Tokyo (JP)

(72) Inventors: Takeshi Okumura, Tokyo (JP);
Tomonaga Nishikawa, Tokyo (JP);
Takashi Nakagawa, Tokyo (JP); Toshio Tomonari, Tokyo (JP)

(73) Assignee: TDK CORPORATION, Tokyo (JP)

(*) Notice: Subject to any disclaimer, the term of this patent is extended or adjusted under 35 U.S.C. 154(b) by 64 days.

(21) Appl. No.: 14/091,030

(22) Filed: Nov. 26, 2013

(65) Prior Publication Data
US 2014/0145796 A1    May 29, 2014

(30) Foreign Application Priority Data
Nov. 28, 2012  (JP) ................. 2012-259842

(51) Int. Cl.
*H03H 7/09*   (2006.01)
*H03H 7/42*   (2006.01)
*H03H 1/00*   (2006.01)

(52) U.S. Cl.
CPC ............ *H03H 7/427* (2013.01); *H03H 7/09* (2013.01); *H03H 2001/0085* (2013.01)

(58) Field of Classification Search
CPC .. H03H 7/427; H03H 2001/0085; H03H 7/09
USPC ............................ 333/12, 181, 185; 336/200
See application file for complete search history.

(56) References Cited

U.S. PATENT DOCUMENTS 7,589,605 B2 *  9/2009  Perreault et al. .............. 333/177
2011/0285477 A1 * 11/2011  Nakagawa et al. ........... 333/185

FOREIGN PATENT DOCUMENTS

JP    2012-129665 A    7/2012

* cited by examiner

*Primary Examiner* — Benny Lee
*Assistant Examiner* — Rakesh Patel
(74) *Attorney, Agent, or Firm* — McGinn IP Law Group, PLLC.

(57) ABSTRACT

A common mode filter is provided with first and second spiral patterns provided on an insulating layer and connected to each other in series, and third and fourth spiral patterns provided on an insulating layer and connected to each other in series. The first and third spiral patterns overlap each other so as to be magnetically coupled with each other. The second and fourth spiral patterns overlap each other so as to be magnetically coupled with each other. Relationships between winding directions of the first and second spiral patterns and between winding directions of the third and fourth spiral patterns are set to cancel out magnetic fluxes of the couples of the spiral patterns each other, respectively. Each number of turns in the first and third spiral patterns is larger than each number of turns in the second and fourth spiral patterns respectively.

15 Claims, 7 Drawing Sheets

COMMON MODE FILTER

BACKGROUND OF THE INVENTION

1. Field of the Invention

The present invention relates to a common mode filter, and more particularly relates to a structure of a thin-film common mode filter.

2. Description of Related Art

In mobile devices, deterioration in reception sensitivity to wireless signals is a problem and the deterioration is caused by the radiation noise generated internally from inside the devices. For suppressing the radiation noise, a common mode filter is mounted on a digital signal line (a differential transmission line) in the device. Recently, such a noise solution is commonly known.

For example, Japanese Patent Application Laid-open No. 2012-129665 describes a common mode filter that can attenuate common mode noise greatly. This common mode filter is constituted by connecting first and second common mode filter elements in series. The lengths of first and second connection conductors are set such that at a desired frequency, the phases of connection points between the first common mode filter element and the first and second connection conductors can be changed by an amount larger than 0 degrees and equal to or smaller than 90 degrees relative to the phases of connection points between the second common mode filter element and the first and second connection conductors. The second common mode filter element serves as a capacitive element (a capacitor) for the common mode and therefore equivalently serves as an LC filter, thereby attenuating common mode noise greatly.

In recent mobile devices, wireless communication techniques not only calling but also one-segment broadcasting, a GPS function, and Wi-Fi can be achieved by one device, and the devices internally generate radiation noise in various frequency bands. When these wireless communication techniques use different frequency bands, it is very important to determine in which of the frequency bands the radiation noise, generated internally from the device, needs to be suppressed.

The conventional common mode filter described above has a large attenuation amount and has a function of greatly suppressing noise at a specific frequency. However, there is a problem in that when noise solutions for plural frequency bands are required to improve the reception sensitivity to wireless communication, the conventional common mode filter cannot provide a sufficient effect of suppressing noise.

SUMMARY

The present invention has been achieved to solve the above problems, and an object of the present invention is to provide a common mode filter that can reduce common mode noise in plural frequency bands and therefore improve the reception sensitivity to wireless communication.

In order to solve the above problems, a common mode filter comprises first and second spiral patterns that are provided on a first plane and that are connected to each other in series, and third and fourth spiral patterns that are provided on a second plane different from the first plane and that are connected to each other in series, wherein the first and third spiral patterns overlap each other in a planar view so as to be magnetically coupled with each other, thereby constituting a first common mode filter element, the second and fourth spiral patterns overlap each other in a planar view so as to be magnetically coupled with each other, thereby constituting a second common mode filter element, each winding direction of the first and second spiral patterns are set to cancel out magnetic fluxes of the first and second spiral patterns each other, each winding direction of the third and fourth spiral patterns are set to cancel out magnetic fluxes of the third and fourth spiral patterns each other, a number of turns in the first spiral pattern is larger than a number of turns in the second spiral pattern, and a number of turns in the third spiral pattern is larger than a number of turns in the fourth spiral pattern.

According to the present invention, the common mode filter that includes the first and second common mode filter elements, having different filter frequencies, connected in series can be provided. Particularly, the direction of a first magnetic flux that is generated by a current flowing through the first spiral pattern and that passes through the first spiral pattern is the same as the direction of a second magnetic flux that is generated by a current flowing through the second spiral pattern and that passes through the second spiral pattern. Also, the direction of a third magnetic flux that is generated by a current flowing through the third spiral pattern and that passes through the third spiral pattern is the same as the direction of a fourth magnetic flux that is generated by a current flowing through the fourth spiral pattern and that passes through the fourth spiral pattern. Therefore, the first common mode filter element and the second common mode filter element can be prevented from being magnetically coupled with each other. Accordingly, common mode noise can be reduced in plural frequency bands. Further, the filter characteristics as described above can be realized by a single chip, and a small-sized high-performance common mode filter can be realized.

In the present invention, it is preferable that an outer peripheral end of the first spiral pattern is connected to an outer peripheral end of the second spiral pattern, an outer peripheral end of the third spiral pattern is connected to an outer peripheral end of the fourth spiral pattern, a direction in which the first spiral pattern is wound from an inner peripheral end thereof toward the outer peripheral end is the same as a direction in which the second spiral pattern is wound from the outer peripheral end toward an inner peripheral end thereof, and a direction in which the third spiral pattern is wound from an inner peripheral end thereof toward the outer peripheral end is the same as a direction in which the fourth spiral pattern is wound from the outer peripheral end toward an inner peripheral end thereof. With this configuration, series connection of the first and second common mode filter elements can be formed easily, and formation of a connecting pattern that connects the first and second common mode filter elements can be omitted.

It is preferable that the common mode filter according to the present invention further comprises fifth and sixth spiral patterns that are provided separately from each other on a third plane different from the first and second planes, and seventh and eighth spiral patterns that are provided separately from each other on a fourth plane different from the first to third planes, wherein the fifth spiral pattern is connected to the first spiral pattern in series, the sixth spiral pattern is connected to the second spiral pattern in series, the seventh spiral pattern is connected to the third spiral pattern in series, the eighth spiral pattern is connected to the fourth spiral pattern in series, the first, third, fifth and seventh spiral patterns overlap each other in a planar view so as to be magnetically coupled with each other, thereby constituting the first common mode filter element, the second, fourth, sixth and eighth spiral patterns overlap each other in a planar view so as to be magnetically coupled with each other, thereby constituting the second common mode filter element, a number of turns in the fifth spiral pattern is larger than a number of turns in the sixth spiral pattern, and a number of turns in the seventh spiral pattern is larger than a number of turns in the eighth spiral pattern. With this configuration, the inductances of coils that constitute the first and second common mode filter elements can be increased, and the improvement in filter characteristics can be achieved.

It is preferable that the common mode filter according to the present invention further comprises first lead pattern that is provided on the third plane and that is connected to an outer peripheral end of the fifth spiral pattern, second lead pattern that is provided on the third plane and that is connected to an outer peripheral end of the sixth spiral pattern, third lead pattern that is provided on the fourth plane and that is connected to an outer peripheral end of the seventh spiral pattern, fourth lead pattern that is provided on the fourth plane and that is connected to an outer peripheral end of the eighth spiral pattern. In this case, preferably, the number of turns in the fifth spiral pattern is smaller than the number of turns in the first spiral pattern, and the number of turns in the seventh spiral pattern is smaller than the number of turns in the third spiral pattern. With this configuration, a lead pattern forming surface can be utilized as a spiral-pattern forming surface. Therefore, reduction in the thickness of a common mode filter chip component can be achieved as compared to a case where a spiral-pattern forming surface is provided in addition to a lead pattern forming surface.

It is preferable that the common mode filter according to the present invention further comprises a first connecting pattern that is provided on a third plane different from the first and second planes and that is connected between an inner peripheral end of the first spiral pattern and an inner peripheral end of the second spiral pattern, and a second connecting pattern that is provided on the third plane and that is connected between an inner peripheral end of the third spiral pattern and an inner peripheral end of the fourth spiral pattern. With this configuration, a series-connection structure of two common mode filter elements can be realized by the smallest number of layers as possible. Therefore, further reduction in the thickness of the common mode filter chip component can be achieved.

According to the present invention, a common mode filter that can reduce common mode noise in plural frequency bands and therefore improve the reception sensitivity of wireless communication can be provided.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiment of the present invention will be described below in detail with reference to the accompanying drawings.

Figure 1:
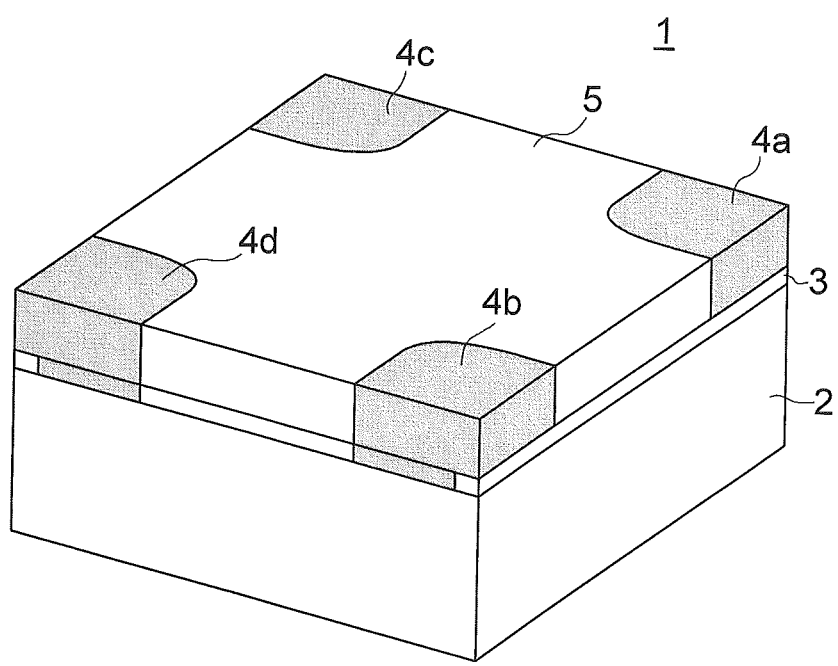
FIG. 1 is a schematic perspective view showing an external configuration of a common mode filter according to a first embodiment of the present invention.

FIG. 1 is a schematic perspective view showing an external configuration of a common mode filter 1 according to a first embodiment of the present invention, and shows a state where the common mode filter 1 is placed upside down.

As shown in FIG. 1, the common mode filter 1 includes a magnetic substrate 2, a functional layer 3 that is provided on the upper surface of the magnetic substrate 2 and that includes a common mode filter element, first to fourth terminal electrodes 4a to 4d that are provided on the upper surface of the functional layer 3, and an insulating resin layer 5 that is provided, along with the first to fourth terminal electrodes 4a to 4d, on the upper surface of the functional layer 3.

The common mode filter 1 is a surface-mount chip component, and its chip size is 0.65×0.5×0.3 (mm), for example. However, the chip size is not particularly limited thereto. The common mode filter 1 according to the first embodiment is of a so-called thin-film type with a stacked structure of conductor patterns formed on a surface of an insulating layer, and is different from a filter of a so-called wire-winding type formed by winding a wire around a core or bobbin.

The magnetic substrate 2 protects the functional layer 3 physically, and also constitutes a part of a magnetic path of the common mode filter 1. A sintered ferrite, a composite ferrite (a ferrite powder-containing resin), and the like can be used as a material of the magnetic substrate 2. However, it is particularly preferable to use a sintered ferrite because it has a high mechanical strength and a high magnetic property.

The first to fourth terminal electrodes 4a to 4d are provided at four corners of a cuboid stacked body, respectively, each of which includes exposed surfaces on the bottom surface and on two side surfaces of the chip. Although not particularly limited, each of the first to fourth terminal electrodes 4a to 4d is formed of a thick-film plated electrode (a bump electrode). The first to fourth terminal electrodes 4a to 4d are sufficiently thicker than an electrode pattern formed on a surface of a base layer by sputtering or screen printing.

The insulating resin layer 5 protects the functional layer 3 physically, and also fixes and supports the first to fourth terminal electrodes 4a to 4d. The insulating resin layer 5 is provided so as to embed therein circumferences of the first to fourth terminal electrodes 4a to 4d. It is preferable to use a composite ferrite as a material of the insulating resin layer 5. With this configuration, the insulating resin layer 5 can be formed as apart of the magnetic path of the common mode filter 1 and can constitute, with the magnetic substrate 2, a closed magnetic path.

Figure 2:
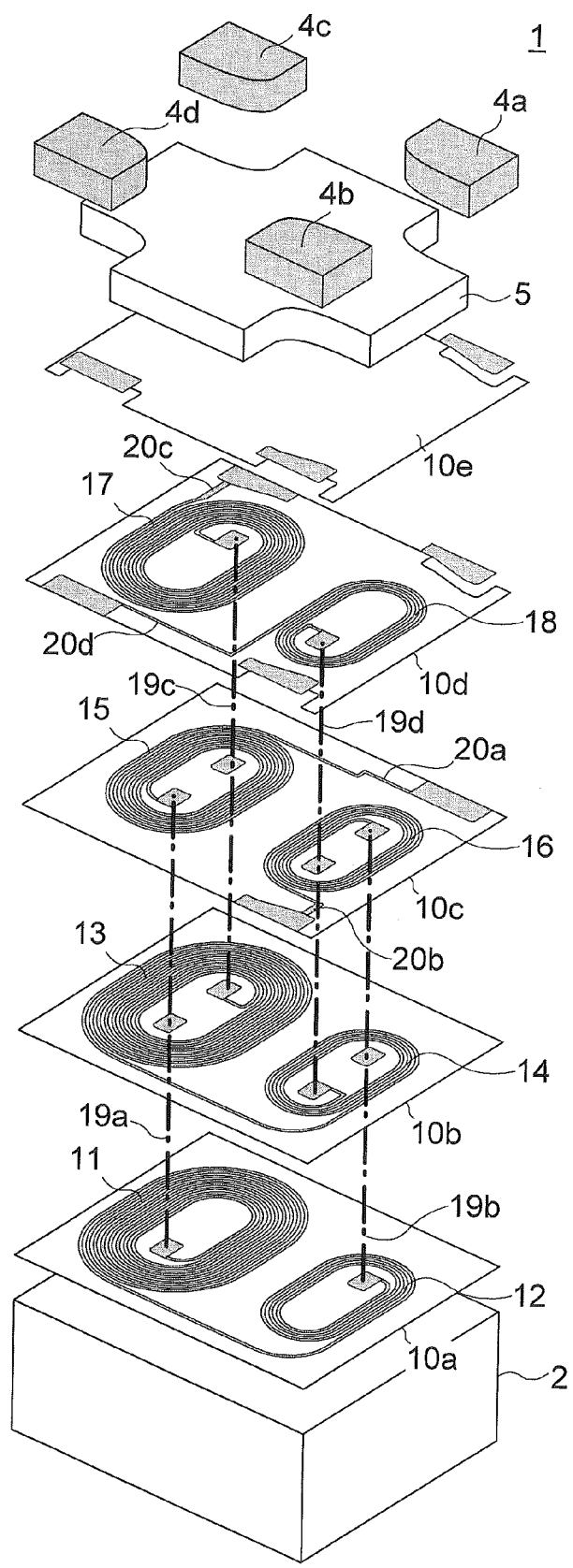
FIG. 2 is a schematic exploded perspective view of the common mode filter according to the first embodiment of the present invention.
Figure 3:
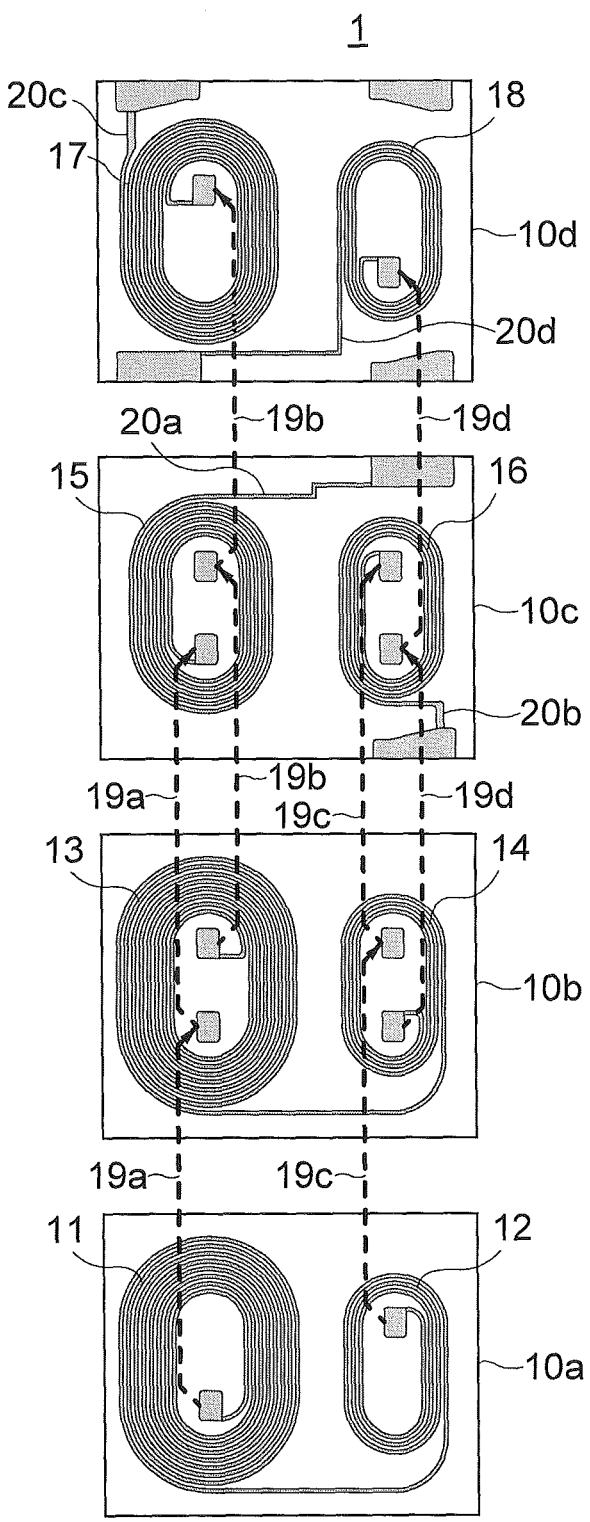
FIG. 3 is a planar layout of layers in the functional layer according to the first embodiment of the present invention.

FIG. 2 is a schematic exploded perspective view of the common mode filter 1. FIG. 3 is a planar layout of layers in the functional layer 3.

As shown in FIGS. 2 and 3, the functional layer 3 includes first to fourth insulating layers 10a to 10d that are stacked in the described order from bottom to top, first and second spiral patterns 11 and 12 that are formed on the upper surface (first plane) of the first insulating layer 10a, third and fourth spiral patterns 13 and 14 that are formed on the upper surface (second plane) of the second insulating layer 10b, fifth and sixth spiral patterns 15 and 16 that are formed on the upper surface (third plane) of the third insulating layer 10c, and seventh and eighth spiral patterns 17 and 18 that are formed on the upper surface (fourth plane) of the fourth insulating layer 10d.

The first and second spiral patterns 11 and 12 are connected to each other in series on the first insulating layer 10a. The third and fourth spiral patterns 13 and 14 are connected to each other in series on the second insulating layer 10b. Particularly, the outer peripheral end of the first spiral pattern 11 is connected to the outer peripheral end of the second spiral pattern 12, and the outer peripheral end of the third spiral pattern 13 is connected to the outer peripheral end of the fourth spiral pattern 14. Two spiral patterns on the same plane are continuously formed by a single line having a constant width, and there are no joints between the spiral patterns.

The fifth and sixth spiral patterns 15 and 16 are not connected to each other on the third insulating layer 10c and are separate from each other. The seventh and eighth spiral patterns 17 and 18 are not connected to each other on the fourth insulating layer 10d and are separate from each other.

The inner peripheral end of the first spiral pattern 11 is connected to the inner peripheral end of the fifth spiral pattern 15 via a first through-hole conductor 19a that passes through the second and third insulating layers 10b and 10c. The inner peripheral end of the second spiral pattern 12 is connected to the inner peripheral end of the sixth spiral pattern 16 via a second through-hole conductor 19b that passes through the second and third insulating layers 10b and 10c. The inner peripheral end of the third spiral pattern 13 is connected to the inner peripheral end of the seventh spiral pattern 17 via a third through-hole conductor 19c that passes through the third and fourth insulating layers 10c and 10d. The inner peripheral end of the fourth spiral pattern 14 is connected to the inner peripheral end of the eighth spiral pattern 18 via a fourth through-hole conductor 19d that passes through the third and fourth insulating layers 10c and 10d.

On the third insulating layer 10c, first and second lead patterns 20a and 20b are provided. The outer peripheral end of the fifth spiral pattern 15 is connected to the first terminal electrode 4a via the first lead pattern 20a. The outer peripheral end of the sixth spiral pattern 16 is connected to the second terminal electrode 4b via the second lead pattern 20b. On the fourth insulating layer 10d, third and fourth lead patterns 20c and 20d are provided. The outer peripheral end of the seventh spiral pattern 17 is connected to the third terminal electrode 4c via the third lead pattern 20c. The outer peripheral end of the eighth spiral pattern 18 is connected to the fourth terminal electrode 4d via the fourth lead pattern 20d.

Figure 4:
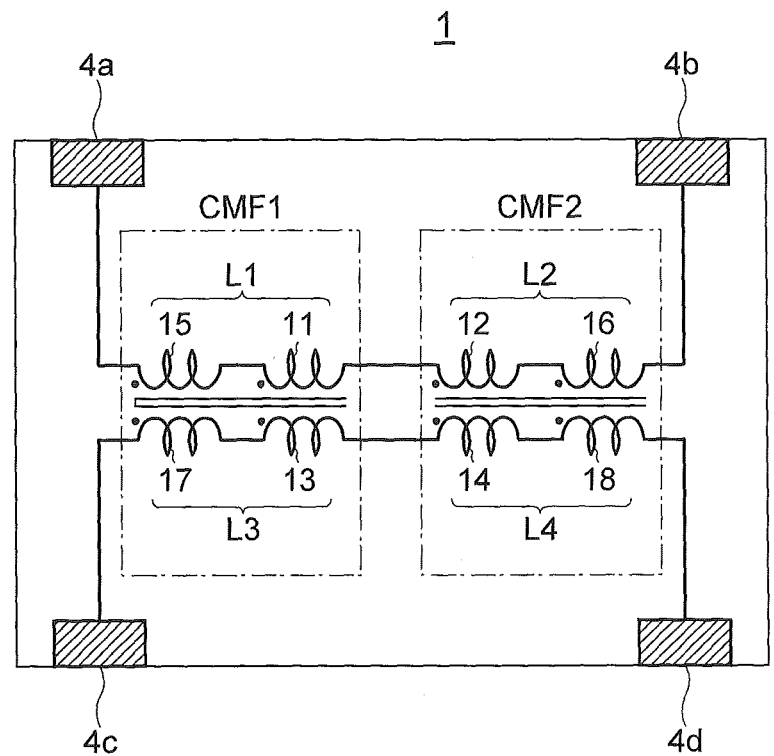
FIG. 4 is an equivalent circuit diagram of the common mode filter according to the first embodiment of the present invention.

FIG. 4 is an equivalent circuit diagram of the common mode filter 1.

As shown in FIGS. 2 to 4, the first and fifth spiral patterns 11 and 15 are connected in series via the first through-hole conductor 19a to constitute a first coil L1. The second and sixth spiral patterns 12 and 16 are connected in series via the second through-hole conductor 19b to constitute a second coil L2. The first and second coils L1 and L2 are connected in series. The third and seventh spiral patterns 13 and 17 are connected in series via the third through-hole conductor 19c to constitute a third coil L3. The fourth and eighth spiral patterns 14 and 18 are connected in series via the fourth through-hole conductor 19d to constitute a fourth coil L4. The third and fourth coils L3 and L4 are connected in series.

The first coil L1 and the third coil L3 are not electrically connected to each other. However, the first, third, fifth, and seventh spiral patterns 11, 13, 15, and 17 have a positional relationship in which they overlap each other in a planar view. Therefore, the first and third spiral patterns 11 and 13 are magnetically coupled with each other, and the fifth and seventh spiral patterns 15 and 17 are magnetically coupled with each other. The third and fifth spiral patterns 13 and 15 are also magnetically coupled with each other; however, they are coupled to a smaller degree than those of the coupling between the first and third spiral patterns 11 and 13 and the coupling between the fifth and seventh spiral patterns 15 and 17. With the configuration described above, the first, third, fifth, and seventh spiral patterns 11, 13, 15, and 17 constitute a first common mode filter element CMF1.

The second coil L2 and the fourth coil L4 are not electrically connected to each other. However, the second, fourth, sixth, and eighth spiral patterns 12, 14, 16, and 18 have a positional relationship in which they overlap each other in a planar view. Therefore, the second and fourth spiral patterns 12 and 14 are magnetically coupled with each other, and the sixth and eighth spiral patterns 16 and 18 are magnetically coupled with each other. The fourth and sixth spiral patterns 14 and 16 are also magnetically coupled with each other; however, they are coupled to a smaller degree than those of the coupling between the second and fourth spiral patterns 12 and 14 and the coupling between the sixth and eighth spiral patterns 16 and 18. With the configuration described above, the second, fourth, sixth, and eighth spiral patterns 12, 14, 16, and 18 constitute a second common mode filter element CMF2.

When a current flows from the first terminal electrode 4a to the second terminal electrode 4b, this current flows through the first lead pattern 20a, the fifth spiral pattern 15, the first through-hole conductor 19a, the first spiral pattern 11, the second spiral pattern 12, the second through-hole conductor 19b, the sixth spiral pattern 16, and the second lead pattern 20b in the described order. When a current flows from the third terminal electrode 4c to the fourth terminal electrode 4d, this current flows through the third lead pattern 20c, the seventh spiral pattern 17, the third through-hole conductor 19c, the third spiral pattern 13, the fourth spiral pattern 14, the fourth through-hole conductor 19d, the eighth spiral pattern 18, and the fourth lead pattern 20d in the described order.

In the first embodiment, the first spiral pattern 11 is wound from its inner peripheral end toward its outer peripheral end in a counterclockwise direction, and the second spiral pattern 12 is wound from its outer peripheral end toward its inner peripheral end also in a counterclockwise direction. That is, the direction in which the first spiral pattern 11 is wound from its inner peripheral end toward its outer peripheral end is the same as the direction in which the second spiral pattern 12 is wound from its outer peripheral end toward its inner peripheral end. Therefore, the direction of a magnetic flux that is generated by a current flowing through the first spiral pattern 11 and that passes through the center portion of the first spiral pattern 11 is the same as the direction of a magnetic flux that is generated by a current flowing through the second spiral pattern 12 and that passes through the center portion of the second spiral pattern 12. A relationship between the third and fourth spiral patterns 13 and 14, a relationship between the fifth and sixth spiral patterns 15 and 16, and a relationship between the seventh and eighth spiral patterns 17 and 18 are also the same as that described above. This can prevent magnetic coupling between two spiral patterns adjacent to each other on the same plane.

In this way, the common mode filter 1 according to the first embodiment has a series-connection structure of the first common mode filter element CMF1 and the second common mode filter element CMF2 that are not magnetically coupled with each other.

Further, in the first embodiment, a number of turns in the first spiral pattern 11 is larger than a number of turns in the second spiral pattern 12, and a number of turns in the third spiral pattern 13 is larger than a number of turns in the fourth spiral pattern 14. A number of turns in the fifth spiral pattern 15 is larger than a number of turns in the sixth spiral pattern 16, and a number of turns in the seventh spiral pattern 17 is larger than a number of turns in the eighth spiral pattern 18. Therefore, the resonant frequency of the first common mode filter element CMF1 can be different from the resonant frequency of the second common mode filter element CMF2.

In the first embodiment, a reason why two spiral patterns, connected to each other in series, are arranged side by side on the same plane is to reduce the thickness of a chip component and also to prevent magnetic coupling between the spiral patterns. When spiral patterns, from which different resonant frequencies are to be obtained, are magnetically coupled with each other, there is a tendency for two resonant peaks to weaken toward one resonant peak. However, when the spiral patterns are prevented from being magnetically coupled with each other, two resonant peaks can be ensured.

In a case where two spiral patterns are arranged side by side on the same plane and their outer peripheral ends are directly connected to each other, it is necessary to lead-out the inner peripheral ends of the spiral patterns to the outside, and therefore it is necessary to provide the lead patterns 20a to 20d on a layer different from the layers on which the spiral patterns 11 to 14 are formed. However, it is inefficient in the layout to provide an additional insulating layer solely for the lead patterns 20a to 20d. Therefore, in the first embodiment, spiral patterns are additionally provided on a lead pattern forming layer to obtain a larger number of turns in the coils L1 to L4, thereby improving inductances.

Preferably, the number of turns in the fifth spiral pattern 15 is smaller than the number of turns in the first spiral patterns 11. Preferably, the number of turns in the seventh spiral pattern 17 is smaller than the number of turns in the third spiral pattern 13. With this configuration, the third and fourth insulating layers 10c and 10d on which the lead patterns 20a to 20d are formed can be efficiently utilized as a surface on which additional spiral patterns are formed, and both securing an area for forming the lead patterns 20a to 20d and improving the inductances of the first and third coils L1 and L3 can be achieved.

Figure 5:
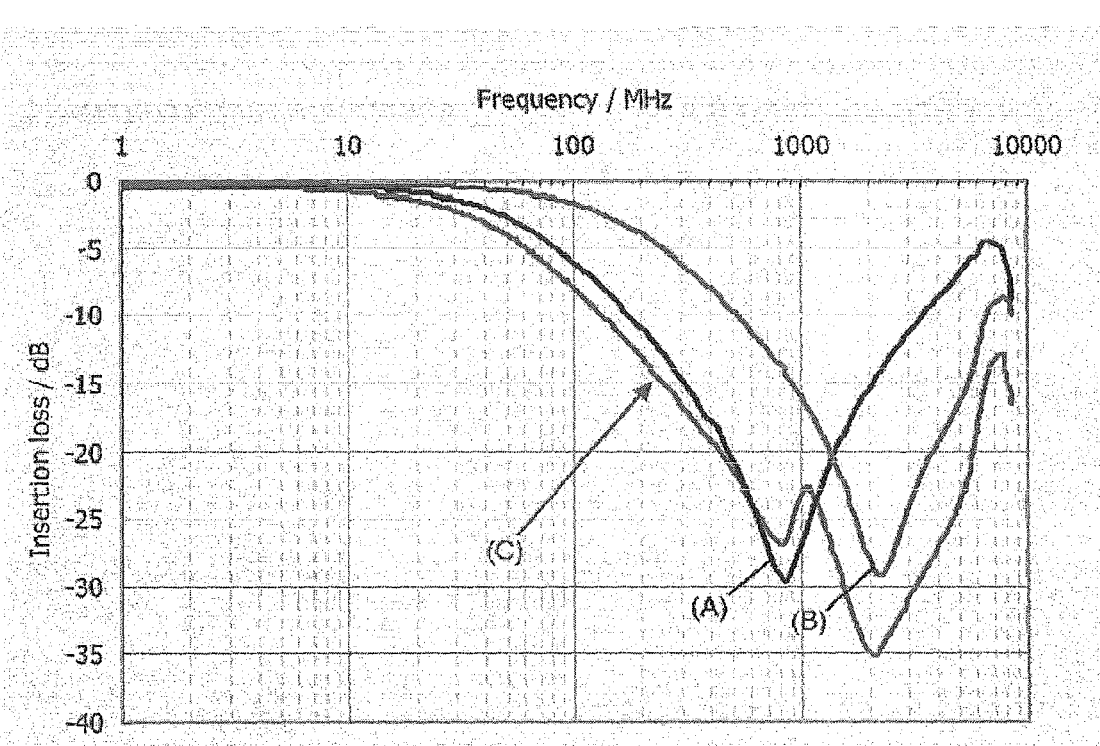
FIG. 5 is graphs showing simulation results of insertion loss characteristics of the common mode filter according to the first embodiment of the present invention.

FIG. 5 is a graph showing simulation results of insertion loss characteristics of the common mode filter 1.

As shown in FIG. 5, in a configuration including only the first common mode filter element CMF1, one resonant frequency is observed at 850 MHz as shown by a graph (A), and in a configuration including only the second common mode filter element CMF2, one resonant frequency is observed at 2.4 GHz as shown by a graph (B). In contrast to that, in a configuration in which the first and second common mode filter elements CMF1 and CMF2 are connected in series, resonant points are observed at both 850 MHz and 2.4 GHz as shown by a graph (C). Therefore, by using the common mode filter 1 according to the first embodiment, GSM®-frequency band noise and WiFi-frequency band noise can both be reduced.

As explained above, in the common mode filter 1 according to the first embodiment, the first, third, fifth, and seventh spiral patterns 11, 13, 15, and 17 have a positional relationship in which they overlap each other in a planar view in such a manner that the first and third spiral patterns 11 and 13 are magnetically coupled with each other and that the fifth and seventh spiral patterns 15 and 17 are magnetically coupled with each other, thereby constituting the first common mode filter element CMF1, and the second, fourth, sixth, and eighth spiral patterns 12, 14, 16, and 18 have a positional relationship in which they overlap each other in a planar view in such a manner that the second and fourth spiral patterns 12 and 14 are magnetically coupled with each other and that the sixth and eighth spiral patterns 16 and 18 are magnetically coupled with each other, thereby constituting the second common mode filter element CMF2. Also, the relationships between the directions in which the first, third, fifth, and seventh spiral patterns 11, 13, 15, and 17 that constitute the first common mode filter element CMF1 are wound, and the directions in which the second, fourth, sixth, and eighth spiral patterns 12, 14, 16, and 18 that constitute the second common mode filter element CMF2 are wound are set to cancel out their magnetic fluxes each other. The number of turns in the first spiral pattern 11 is larger than the number of turns in the second spiral pattern 12, and the number of turns in the third spiral pattern 13 is larger than the number of turns in the fourth spiral pattern 14. Therefore, the resonant frequency of the first common mode filter element CMF1 can be different from the resonant frequency of the second common mode filter element CMF2, and thus a common mode filter with two resonant points can be realized by a single chip.

Figure 6:
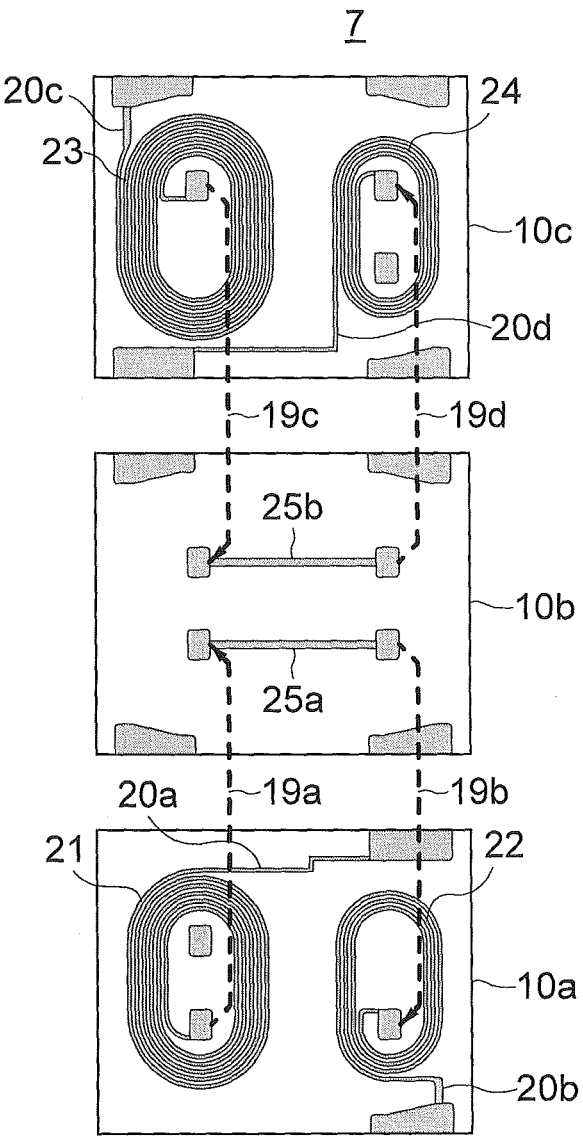
FIG. 6 shows a configuration of a common mode filter according to a second embodiment of the present invention, and is a planar layout of layers in the functional layer.
Figure 7:
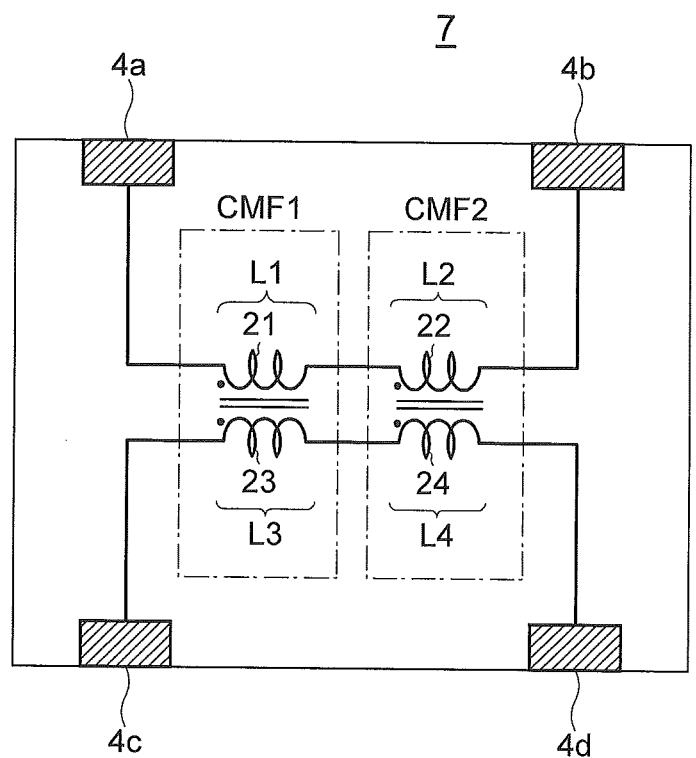
FIG. 7 is an equivalent circuit diagram of the common mode filter according to the second embodiment of the present invention.

FIG. 6 shows a configuration of a common mode filter 7 according to a second embodiment of the present invention, and is a planar layout of layers in the functional layer 3. FIG. 7 is an equivalent circuit diagram of the common mode filter 7.

As shown in FIG. 6, the functional layer 3 of the common mode filter 7 according to the second embodiment includes the first to third insulating layers 10a to 10c that are stacked in the described order from bottom to top. First and second spiral patterns 21 and 22 are provided on the upper surface of the first insulating layer 10a. Third and fourth spiral patterns 23 and 24 are provided on the upper surface of the third insulating layer 10c. Although it is necessary to provide a fourth insulating layer on the upper surface of the third insulating layer 10c as a cover layer in practice, the fourth insulating layer is not shown in this example.

The first and second spiral patterns 21 and 22 are connected at their inner peripheral ends to each other via a first connecting pattern 25a provided on the upper surface of the second insulating layer 10b. The third and fourth spiral patterns 23 and 24 are connected at their inner peripheral ends to each other via a second connecting pattern 25b provided on the upper surface of the second insulating layer 10b. Specifically, the inner peripheral end of the first spiral pattern 21 is connected to one end of the first connecting pattern 25a via the first through-hole conductor 19a, and the inner peripheral end of the second spiral pattern 22 is connected to the other end of the first connecting pattern 25a via the second through-hole conductor 19b. The inner peripheral end of the third spiral pattern 23 is connected to one end of the second connecting pattern 25b via the third through-hole conductor 19c, and the inner peripheral end of the fourth spiral pattern 24 is connected to the other end of the second connecting pattern 25b via the fourth thorough-hole conductor 19d. Other basic configurations are substantially the same as those in the common mode filter 1 according to the first embodiment, and thus detailed explanations thereof will be omitted.

As shown in FIG. 7, in the second embodiment, the first and third spiral patterns 21 and 23 constitute the first common mode filter element CMF1, and the second and fourth spiral patterns 22 and 24 constitute the second common mode filter element CMF2. The first spiral pattern 21 and the second spiral pattern 22 are prevented from being magnetically coupled with each other. The third spiral pattern 23 and the fourth spiral pattern 24 are prevented from being magnetically coupled with each other. Furthermore, the number of turns in the first spiral pattern 21 is larger than the number of turns in the second spiral pattern 22, and the number of turns in the third spiral pattern 23 is larger than the number of turns in the fourth spiral pattern 24. Therefore, similarly to the first embodiment, the resonant frequency of the first common mode filter element CMF1 can be different from the resonant frequency of the second common mode filter element CMF2, and thus a common mode filter with two resonant points can be realized by a single chip.

It is apparent that the present invention is not limited to the above embodiments, but may be modified and changed without departing from the scope and sprit of the invention.

In the above embodiments, an example in which two common mode filter elements are connected in series has been explained. However, in the present invention, the number of elements to be connected in series is not particularly limited, and three or more common mode filter elements can also be connected in series.

Further, the above embodiments employ a structure in which the functional layer 3 is interposed between the magnetic substrate 2 and the insulating resin layer 5. However, the present invention is not limited to such a structure, and can employ various structures. Therefore, a structure in which the functional layer 3 is sandwiched vertically by the magnetic substrates 2 or a structure in which. the functional layer 3 is sandwiched vertically by the insulating resin layers 5 can also be employed, for example.

Furthermore, in the above embodiments, a case where two spiral patterns on the same plane are connected at their outer peripheral ends or inner peripheral ends to each other has been explained as an example. However, the present invention is not limited to such a configuration, and the outer peripheral end of one of the spiral patterns and the inner peripheral end of the other spiral pattern can also be connected to each other.

What is claim is:

1. A common mode filter comprising:
    first and second spiral patterns that are provided on a first plane and that are connected to each other in series; and
    third and fourth spiral patterns that are provided on a second plane different from the first plane and that are connected to each other in series, wherein
    the first and third spiral patterns overlap each other in a planar view so as to be magnetically coupled with each other, thereby constituting a first common mode filter element,
    the second and fourth spiral patterns overlap each other in the planar view so as to be magnetically coupled with each other, thereby constituting a second common mode filter element,
    each winding direction of the first and second spiral patterns is set to cancel out magnetic fluxes of the first and second spiral patterns between each other,
    each winding direction of the third and fourth spiral patterns is set to cancel out magnetic fluxes of the third and fourth spiral patterns between each other,
    an outer peripheral end of the first spiral pattern is connected to an outer peripheral end of the second spiral pattern,
    an outer peripheral end of the third spiral pattern is connected to an outer peripheral end of the fourth spiral pattern,
    a direction in which the first spiral pattern is wound from an inner peripheral end thereof toward the outer peripheral end thereof is the same as a direction in which the second spiral pattern is wound from the outer peripheral end thereof toward an inner peripheral end thereof, and
    a direction in which the third spiral pattern is wound from an inner peripheral end thereof toward the outer peripheral end thereof is the same as a direction in which the fourth spiral pattern is wound from the outer peripheral end thereof toward an inner peripheral end thereof,
    a number of turns in the first spiral pattern is larger than a number of turns in the second spiral pattern, and
    a number of turns in the third spiral pattern is larger than a number of turns in the fourth spiral pattern.

2. The common mode filter as claimed in claim 1 further comprising:
    fifth and sixth spiral patterns that are provided separately from each other on a third plane different from the first and second planes; and
    seventh and eighth spiral patterns that are provided separately from each other on a fourth plane different from the first to third planes, wherein
    the fifth spiral pattern is connected to the first spiral pattern in series,
    the sixth spiral pattern is connected to the second spiral pattern in series,
    the seventh spiral pattern is connected to the third spiral pattern in series,
    the eighth spiral pattern is connected to the fourth spiral pattern in series,
    the first, third, fifth and seventh spiral patterns overlap each other in the planar view so as to be magnetically coupled with each other, thereby constituting the first common mode filter element,
    the second, fourth, sixth and eighth spiral patterns overlap each other in the planar view so as to be magnetically coupled with each other, thereby constituting the second common mode filter element,
    a number of turns in the fifth spiral pattern is larger than a number of turns in the sixth spiral pattern, and
    a number of turns in the seventh spiral pattern is larger than a number of turns in the eighth spiral pattern.

3. The common mode filter as claimed in claim 2 further comprising
    a first lead pattern that is provided on the third plane and that is connected to an outer peripheral end of the fifth spiral pattern,
    a second lead pattern that is provided on the third plane and that is connected to an outer peripheral end of the sixth spiral pattern,
    a third lead pattern that is provided on the fourth plane and that is connected to an outer peripheral end of the seventh spiral pattern, and
    a fourth lead pattern that is provided on the fourth plane and that is connected to an outer peripheral end of the eighth spiral pattern.

4. The common mode filter as claimed in claim 3, wherein
    the number of turns in the fifth spiral pattern is smaller than the number of turns in the first spiral pattern, and
    the number of turns in the seventh spiral pattern is smaller than the number of turns in the third spiral pattern.

5. The common mode filter as claimed in claim 2, further comprising first to fourth insulating layers that are stacked in the described order, wherein
    the first plane is an upper surface of the first insulating layer, the second plane is an upper surface of the second insulating layer,
the third plane is an upper surface of the third insulating layer, and
the fourth plane is an upper surface of the fourth insulating layer.

6. The common mode filter as claimed in claim 5, further comprising:
a magnetic substrate;
a functional layer that is provided on an upper surface of the magnetic substrate;
first to fourth terminal electrodes and an insulating resin layer that are provided on an upper surface of the functional layer; and,
wherein
the functional layer includes the first to fourth insulating layer.

7. The common mode filter as claimed in claim 6, wherein a material of the magnetic substrate is a sintered ferrite, and a material of the insulating resin layer is a composite ferrite.

8. The common mode filter as claimed in claim 6, wherein
the inner peripheral end of the first spiral pattern is connected to an inner peripheral end of the fifth spiral pattern through a first through-hole conductor,
the inner peripheral end of the second spiral pattern is connected to an inner peripheral end of the sixth spiral pattern through a second through-hole conductor,
the inner peripheral end of the third spiral pattern is connected to an inner peripheral end of the seventh spiral pattern through a third through-hole conductor, and
the inner peripheral end of the fourth spiral pattern is connected to an inner peripheral end of the eighth spiral pattern through a fourth through-hole conductor.

9. The common mode filter as claimed in claim 8, wherein
an outer peripheral end of the fifth spiral pattern is connected to the first terminal electrode through a first lead pattern that is provided on the third plane,
an outer peripheral end of the sixth spiral pattern is connected to the second terminal electrode through a second lead pattern that is provided on the third plane,
an outer peripheral end of the seventh spiral pattern is connected to the third terminal electrode through a third lead pattern that is provided on the fourth plane, and
an outer peripheral end of the eighth spiral pattern is connected to the fourth terminal electrode through a fourth lead pattern that is provided on the fourth plane.

10. A common mode filter comprising:
first and second spiral patterns that are provided on a first plane and that are connected to each other in series; and
third and fourth spiral patterns that are provided on a second plane different from the first plane and that are connected to each other in series,
a first connecting pattern that is provided on a third plane different from the first and second planes and that is connected between an inner peripheral end of the first spiral pattern and an inner peripheral end of the second spiral pattern, and
a second connecting pattern that is provided on the third plane and that is connected between an inner peripheral end of the third spiral pattern and an inner peripheral end of the fourth spiral pattern, wherein
the first and third spiral patterns overlap each other in a planar view so as to be magnetically coupled with each other, thereby constituting a first common mode filter element,
the second and fourth spiral patterns overlap each other in the planar view so as to be magnetically coupled with each other, thereby constituting a second common mode filter element,
each winding direction of the first and second spiral patterns is set to cancel out magnetic fluxes of the first and second spiral patterns between each other,
each winding direction of the third and fourth spiral patterns is set to cancel out magnetic fluxes of the third and fourth spiral patterns between each other,
a number of turns in the first spiral pattern is larger than a number of turns in the second spiral pattern, and
a number of turns in the third spiral pattern is larger than a number of turns in the fourth spiral pattern.

11. The common mode filter as claimed in claim 10, wherein
a direction in which the first spiral pattern is wound from an outer peripheral end thereof toward the inner peripheral end thereof is the same as a direction in which the second spiral pattern is wound from the inner peripheral end toward an outer peripheral end thereof, and
a direction in which the third spiral pattern is wound from an outer peripheral end thereof toward the inner peripheral end thereof is the same as a direction in which the fourth spiral pattern is wound from the inner peripheral end toward an outer peripheral end thereof.

12. The common mode filter as claimed in claim 10, further comprising first to third insulating layers that are stacked in the described order, wherein
the first plane is an upper surface of the first insulating layer,
the second plane is an upper surface of the third insulating layer, and
the third plane is an upper surface of the second insulating layer.

13. The common mode filter as claimed in claim 12, further comprising:
a magnetic substrate;
a functional layer that is provided on the upper surface of the magnetic substrate;
first to fourth terminal electrodes and an insulating resin layer that are provided on the upper surface of the functional layer; and
wherein
the functional layer includes the first to third insulating layer.

14. The common mode filter as claimed in claim 13, wherein
a material of the magnetic substrate is a sintered ferrite, and
a material of the insulating resin layer is a composite ferrite.

15. The common mode filter as claimed in claim 13, wherein
an outer peripheral end of the first spiral pattern is connected to the first terminal electrode through a first lead pattern that is provided on the first plane,
an outer peripheral end of the second spiral pattern is connected to the second terminal electrode through a second lead pattern that is provided on the first plane,
an outer peripheral end of the third spiral pattern is connected to the third terminal electrode through a third lead pattern that is provided on the second plane, and
an outer peripheral end of the fourth spiral pattern is connected to the fourth terminal electrode through a fourth lead pattern that is provided on the second plane.

* * * * *